(12) United States Patent
Sze et al.

(10) Patent No.: US 6,190,956 B1
(45) Date of Patent: Feb. 20, 2001

(54) FORMING A CAPACITOR STRUCTURE OF A SEMICONDUCTOR

(75) Inventors: Jhy-Jyi Sze, Tainan; Jung-Chao Chiou, Hsin-chu, both of (TW)

(73) Assignee: United Microelectronics Corp., Hsin-Chu (TW)

( * ) Notice: Under 35 U.S.C. 154(b), the term of this patent shall be extended for 0 days.

(21) Appl. No.: 09/495,243

(22) Filed: Jan. 31, 2000

(51) Int. Cl.$^7$ .................................................. H01L 21/8242
(52) U.S. Cl. ...................... 438/239; 438/238; 438/240; 438/250; 438/381; 438/393
(58) Field of Search .................... 438/238, 239, 438/240, 250, 381, 393

(56) References Cited

U.S. PATENT DOCUMENTS

| | | | |
|---|---|---|---|
| 5,710,073 | * | 1/1998 | Jeng et al. ............................ 438/239 |
| 6,066,528 | * | 5/2000 | Fazan et al. ........................ 438/240 |
| 6,097,051 | * | 8/2000 | Torri et al. ........................... 438/240 |

* cited by examiner

*Primary Examiner*—Trung Dang

(57) ABSTRACT

A method for forming a capacitor structure of semiconductor is disclosed. The method includes the following steps. First of all, a first oxide layer is deposited. A first nitride layer is formed. Consequentially, a portion of the first nitride layer and a portion of the first oxide layer are all etched. Then, the first polysilicon layer is formed. The portion of the first polysilicon layer is reduced to a specified thickness. Next, boron phosphorus silicon glass layer blankly and conformably is formed. Then, a portion of said boron phosphorus silicon glass layer is etched. A second polysilicon layer is deposited. Next, a portion of the second polysilicon layer is etched back. Next, the boron phosphorus silicon glass layer is etched. Then, the first polysilicon layer is etched back. A second nitride layer is formed. Next, a second oxide layer is deposited. Finally, a conductive layer is formed as a top plate of capacitor, whereby a capacitor structure is completed and there are a top plate and a bottom plate.

19 Claims, 12 Drawing Sheets

FORMING A CAPACITOR STRUCTURE OF A SEMICONDUCTOR

BACKGROUND OF THE INVENTION

1. Field of the Invention

The invention relates to form a capacitor structure of a semiconductor, more particularly the method is completed by improving the thickness of the silicon nitride layer.

2. Description of the Prior Art

In the prior art, first of all, as FIG. 1A, an atmosphere-pressure oxide layer 121 is deposited onto the surface of a semiconductor substrate 120. Especially, there are cells 150 formed into the semiconductor substrate 120 already. Then, a silicon nitride 122 is formed on the surface of the atmosphere-pressure oxide layer 121. Again, a low-pressure oxide layer 123 is formed on the surface of the silicon nitride 122. Then, a first photoresist 161 is formed onto the first nitride layer 123 to define a polysilion dielectric layer 181.

Consequentially, as FIG. 1B, a portion of the low-pressure oxide layer 123, the nitride layer 122 and a portion of the atmosphere-pressure oxide layer 121 are all etched as columns using the conventional dry etching to form an opening 181. These columns will conclude the low-pressure oxide layer 123, the nitride layer 122 and the atmosphere-pressure oxide layer 121.

Then, as FIG. 1C, by the chemical vapor deposition, the first polysilicon layer 124 is formed on the surface of the low-pressure oxide layer 123 and is filled up into the first opening 180 and is covered on the low-pressure oxide layer 123. The second photoresist 162 is formed on the polysilicon layer 124 to define the opening of the polysilicon via.

As the FIG. 1D, the portion of the first polysilicon layer 124 is etched using the dry etching to form a bottom plate of the capacitor. Here, the photoresist layer 162 is used as an etch mask.

Next, as FIG. 1E, a silicon nitride layer 125 is formed on the surface of the polysilicon layer 124 using the chemical vapor deposition. The thickness of this silicon nitride layer 125 is about 50 angstroms. There is the topographic effect happened on the silicon nitride layer 125, such as legend 10. This topographic effect will seriously damage the function of cell.

As FIG. 1F, the wet oxidation layer 126 is deposited onto the silicon nitride 125 using the wet chemical deposition to form the top plate 127 of the capacitor. Therefore the capacitor structure is completed.

In the incubation time of the process, the thickness of nitride deposited on the oxide is thinner than the nitride deposited on the silicon. While the thickness of oxide-nitride-oxide layer is reduce, the topographic effect of the thin nitride deposition in the process will make the nitride thickness between the silicon and inter-polysilicon dielectric boundary becomes too thin, also this withstands the following wet oxidation process. At this time, grain boundary oxidation may occur at the neck of polysilicon via, which results in abnormal increment of node contact resistance.

SUMMARY OF THE INVENTION

In accordance with the present invention, a method is provided for forming a capacitor structure that substantially improves the topographic effect from the silicon nitride layer.

In the preferred embodiment, the silicon nitride layer located on the polysilicon dielectric layer and etching back a portion of the polysilicon layer can form the bottom plate of capacitor.

In the preferred embodiment, the thickness of silicon nitride layer can be reduced when the polysilicon layer is etching back.

In one embodiment, first of all, a first oxide layer is deposited onto the surface of a semiconductor substrate. A first nitride layer is formed onto the surface of the first nitride layer. Then, a first photoresist is formed onto the first nitride layer to define a first opening.

Consequentially, a portion of the first nitride layer and a portion of the first oxide layer are all etched using the first photoresist layer as an etch mask until the semiconductor substrate being exposed to define a first opening. Then, the first polysilicon layer is formed on the surface of the semiconductor substrate and on the surface of the first nitride layer, wherein the first polysilicon layer is filled up into the first opening and is covered on said first nitride layer. The portion of the first polysilicon layer is reduced to a specified thickness for the surface of the first polysilicon layer until the remained first polysilicon layer can cover the first nitride layer and covering the first opening. Next, boron phosphorus silicon glass layer blankly and conformably is formed on the surface of the first polysilicon layer. A second photoresist is formed on the boron phosphorus silicon glass layer to define a capacitor region. Then, a portion of said boron phosphorus silicon glass layer is etched until the first polysilicon layer is exposed to form a second opening on the first opening.

A second polysilicon layer is deposited into the second opening to cover the surface of the boron phosphorus silicon glass layer. Next, a portion of the second polysilicon layer is etched back until the surface of the boron phosphorus silicon glass layer is exposed. Next, the boron phosphorus silicon glass layer is etched, whereby the second polysilicon layer is remained on the surface of the first polysilicon. Then, the first polysilicon layer is etched back until the first nitride layer is exposed, wherein the first polysilicon layer is used as a bottom plate of the capacitor.

A second nitride layer is formed onto the surface of the first nitride layer, the surface of the first polysilicon layer and the surface of the second polysilicon layer. Next, a second oxide layer is deposited onto the surface of the second nitride layer. Finally, a conductive layer is formed as a top plate of capacitor, whereby a capacitor structure is completed and there are a top plate and a bottom plate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to a capacitor structure, it is not intended that these illustrations be a limitation on the scope or applicability of the present invention. Thus, it is not intended that the semiconductor devices of the present invention be limited to the structures illustrated. These devices are included to demonstrate the utility and application of the present invention to presently preferred embodiments.

The spirit of the proposed invention can be explained and understood by the following embodiments with corresponding figures. It will briefly be noted here that substrate in FIGS. 2A to 2M. Normally, the method for forming a capacitor structure of a semiconductor will comprise the following steps.

Figure 1A:
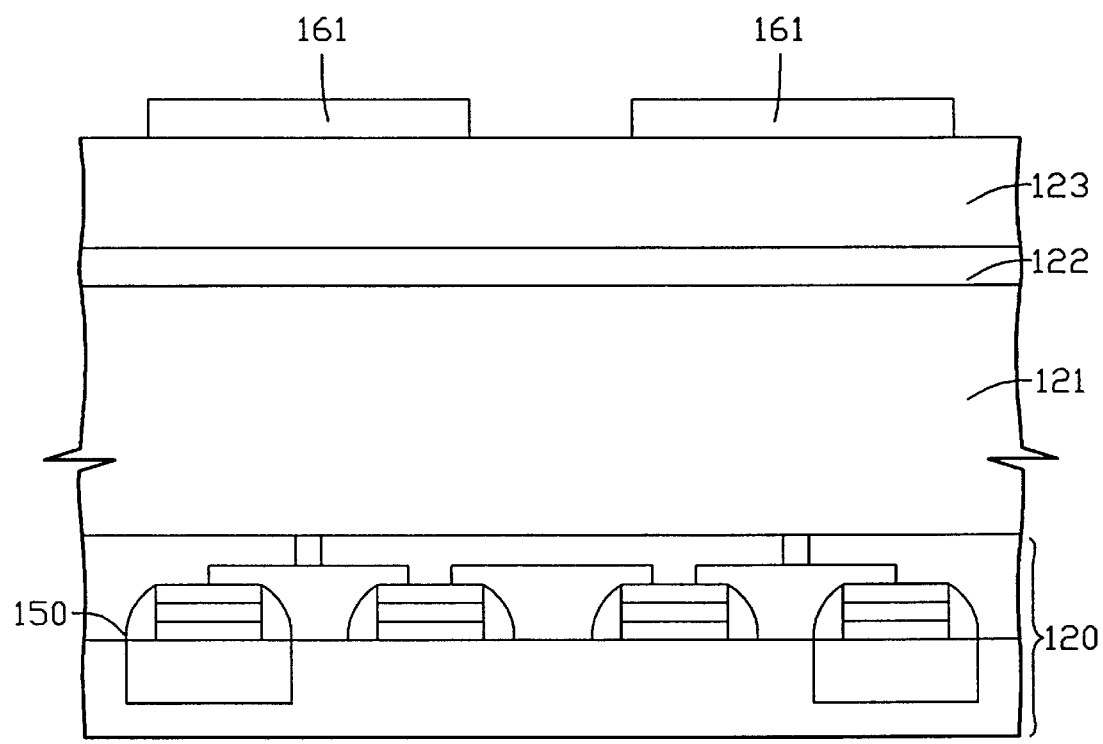
FIGS. 1A to 1F are illustrative of various components in the structure of the prior art.
Figure 1B:
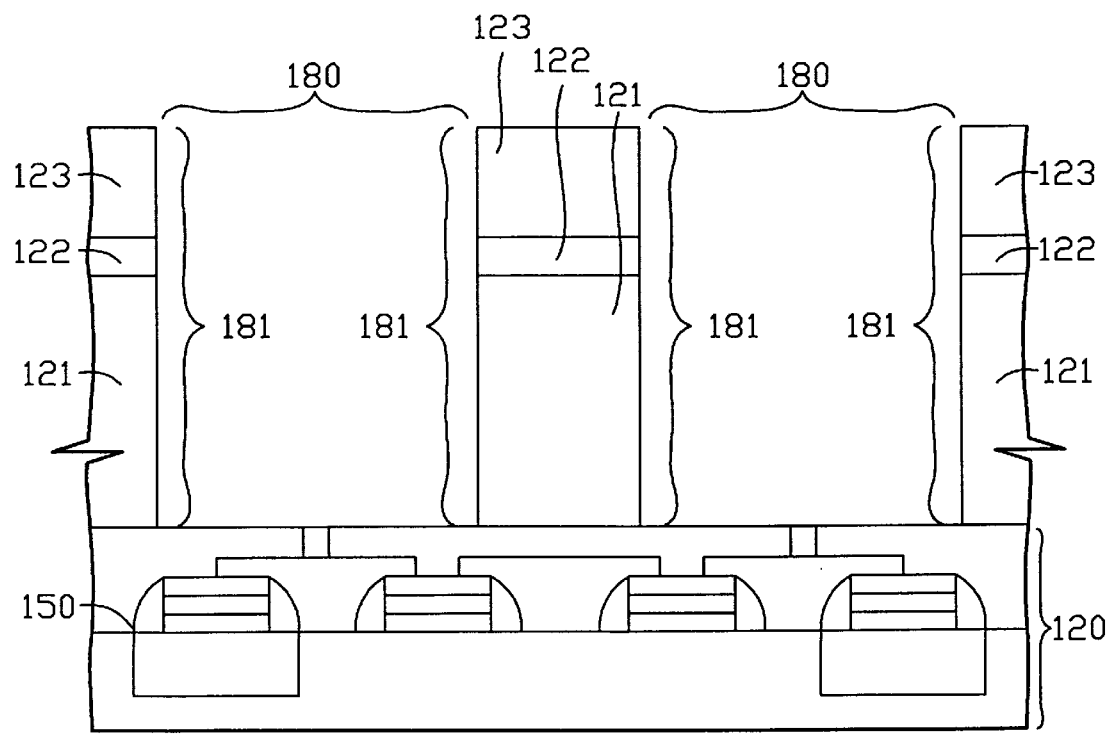
Figure 1C:
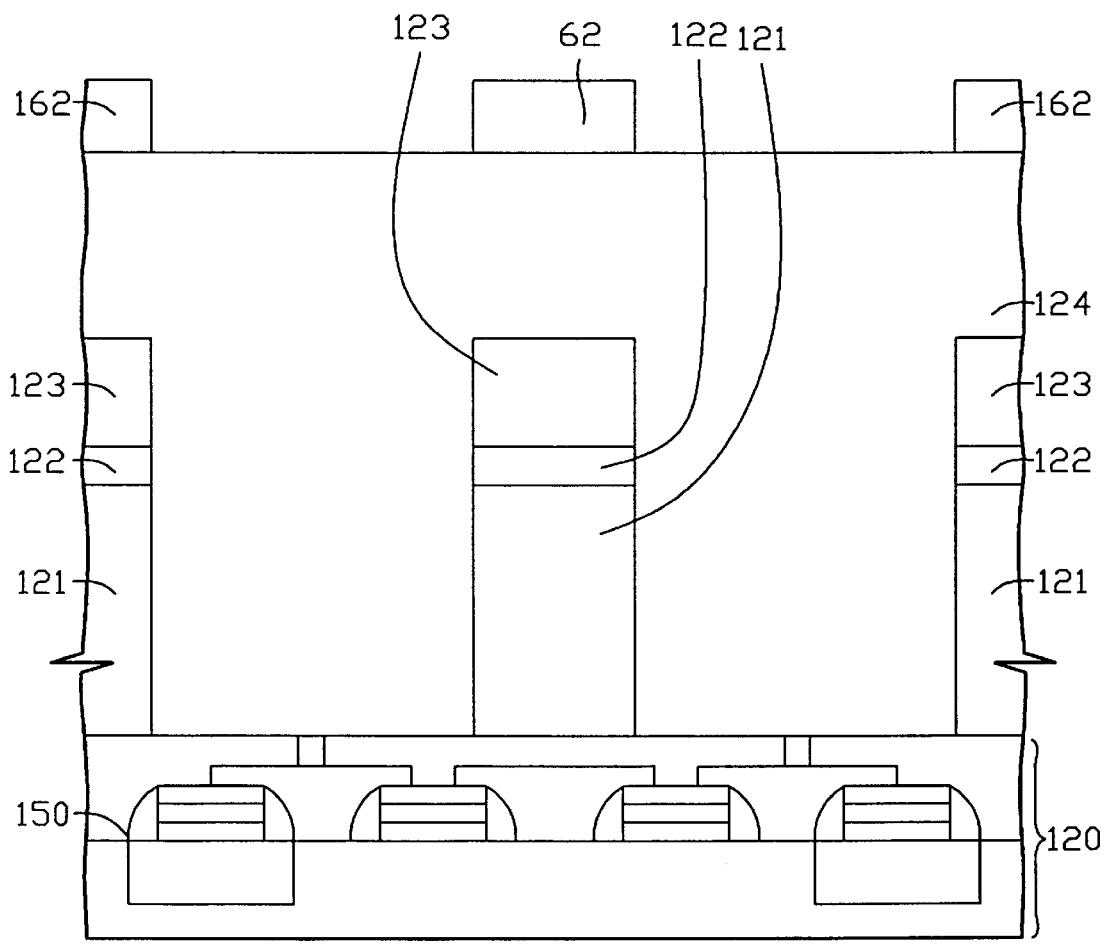
Figure 1D:
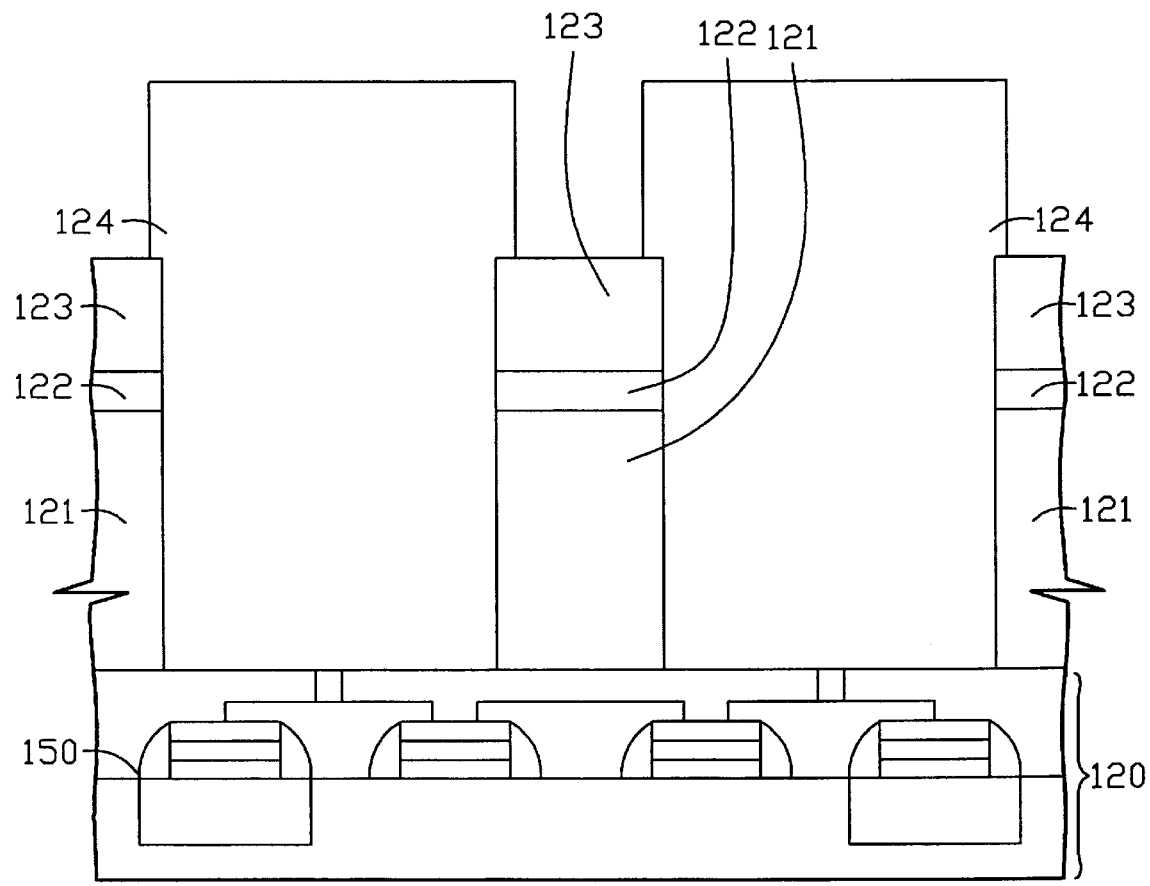
Figure 1E:
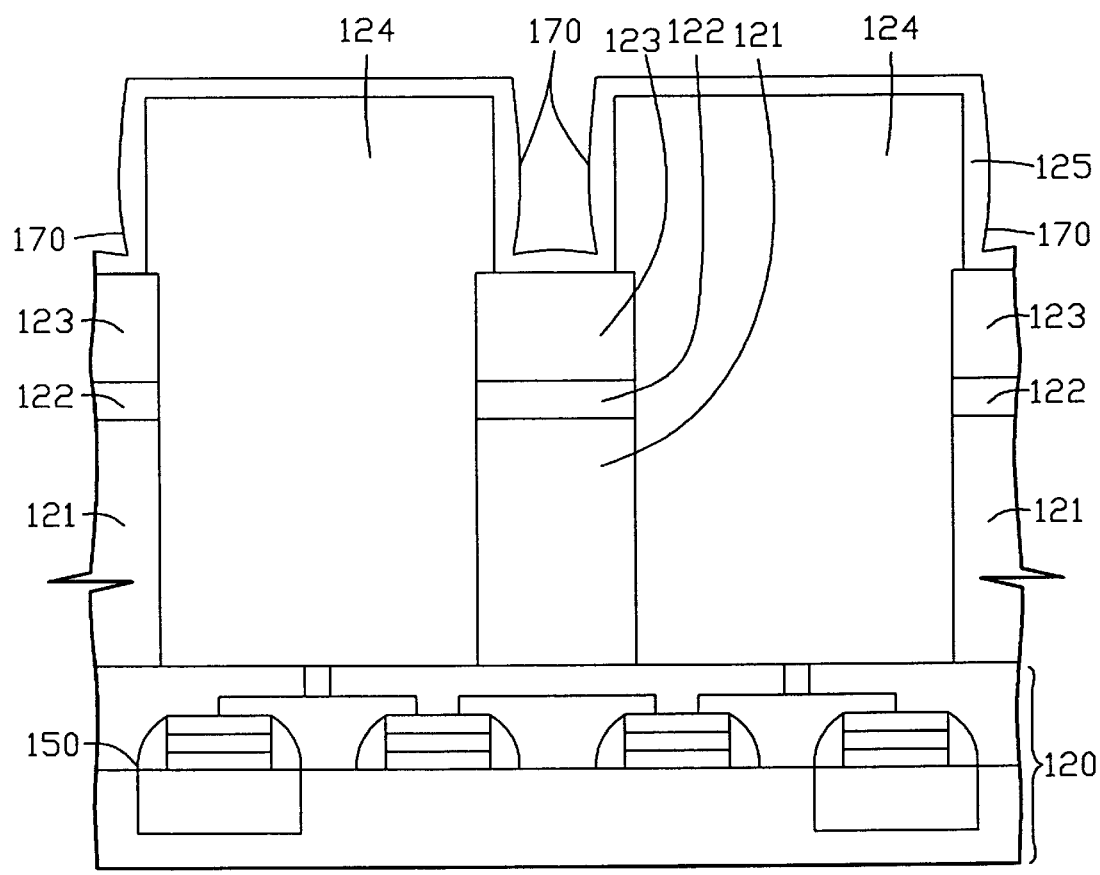
Figure 1F:
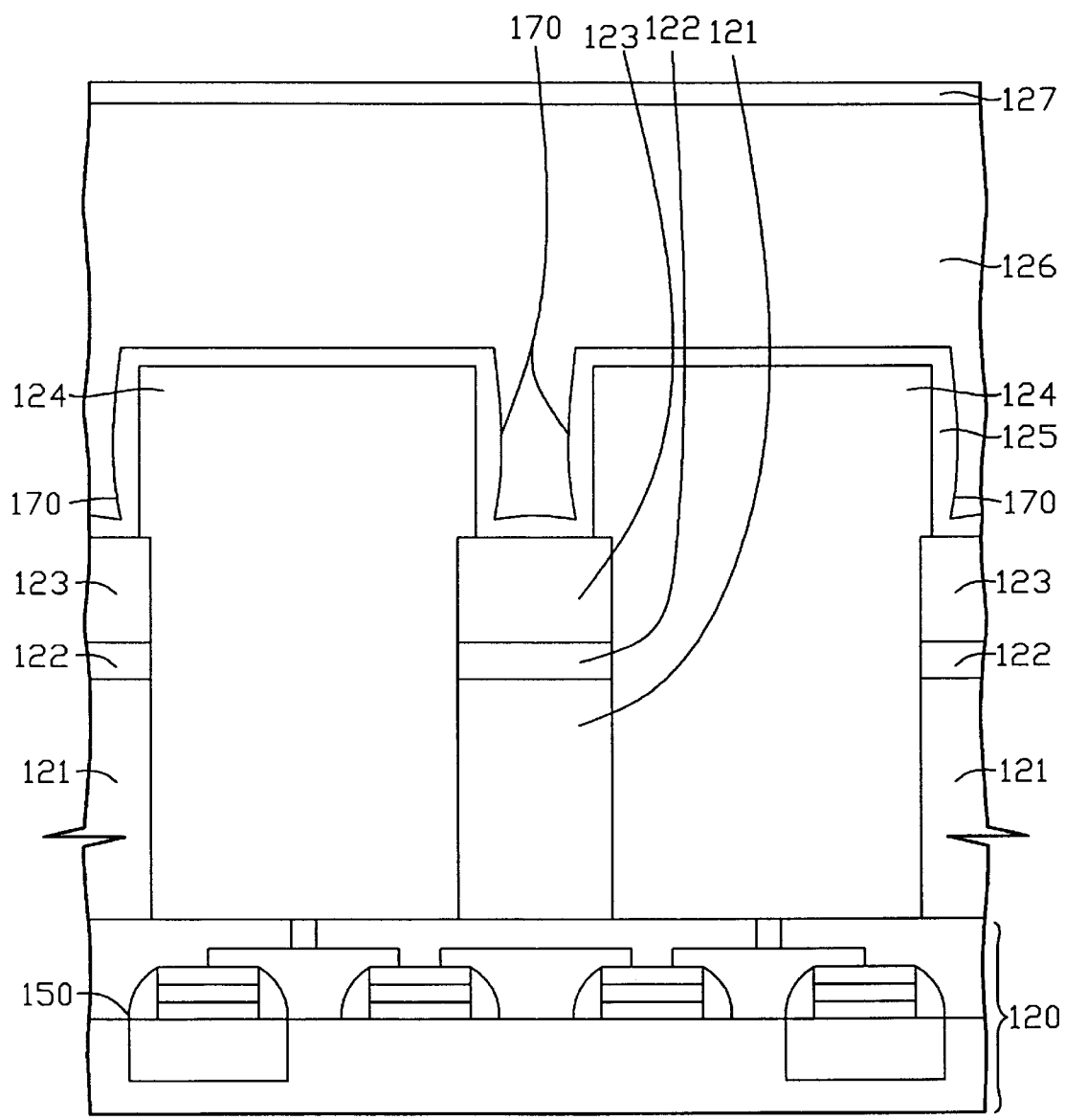
Figure 2A:
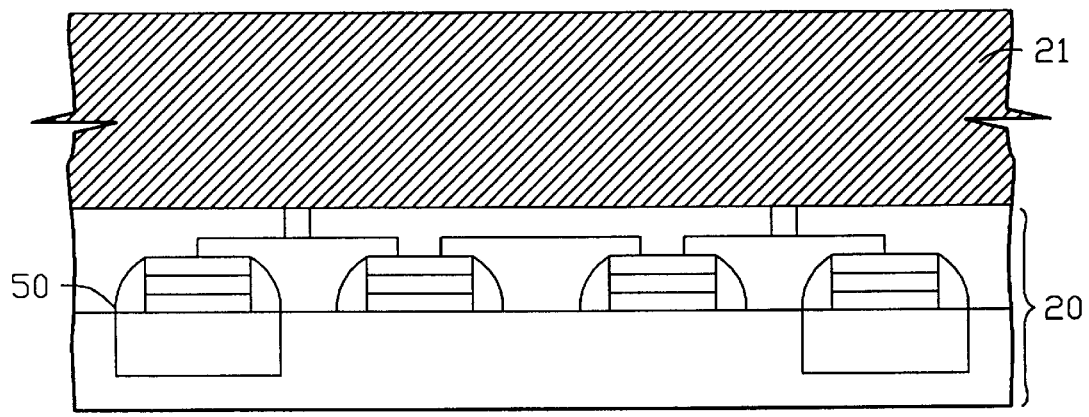
FIGS. 2A to 2M are schematic diagrams showing the structure of the embodiment of present invention.

First of all, as FIG. 2A, a first oxide layer 21 such as silicon dioxide is deposited onto the surface of a semiconductor substrate 20 using the conventional chemical vapor deposition (CVD). The thickness of this first silicon dioxide layer is about 3000 angstroms, the formation temperature is controlled at about 400° C. to 700° C. and the pressure is at about few torrs to 100 mtorrs. Especially, there are cells 50 formed into the semiconductor substrate 20 already.

Figure 2B:
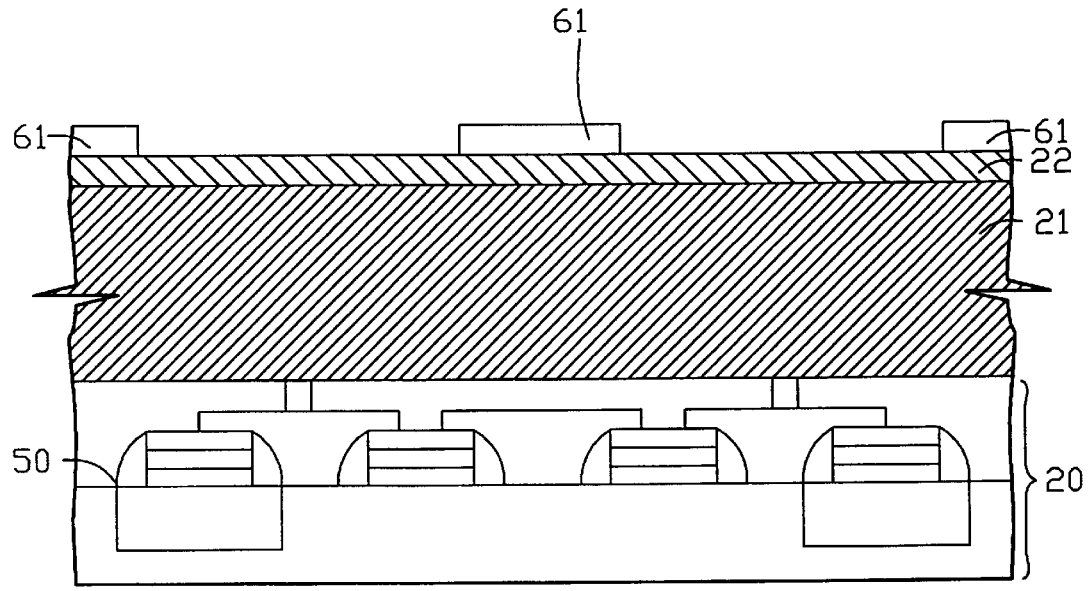

As FIG. 2B, a first nitride layer 22 such as silicon nitride is formed onto the surface of the first silicon dioxide layer 21 using the conventional chemical vapor deposition. The thickness of this first silicon nitride layer is about 100 to 200 angstroms, the formation temperature is controlled at about 600° C. to 700° C. and the pressure is at about few torrs to 100 mtorrs. Then, a first photoresist 61 is formed onto the first nitride layer to define a first opening.

Figure 2C:
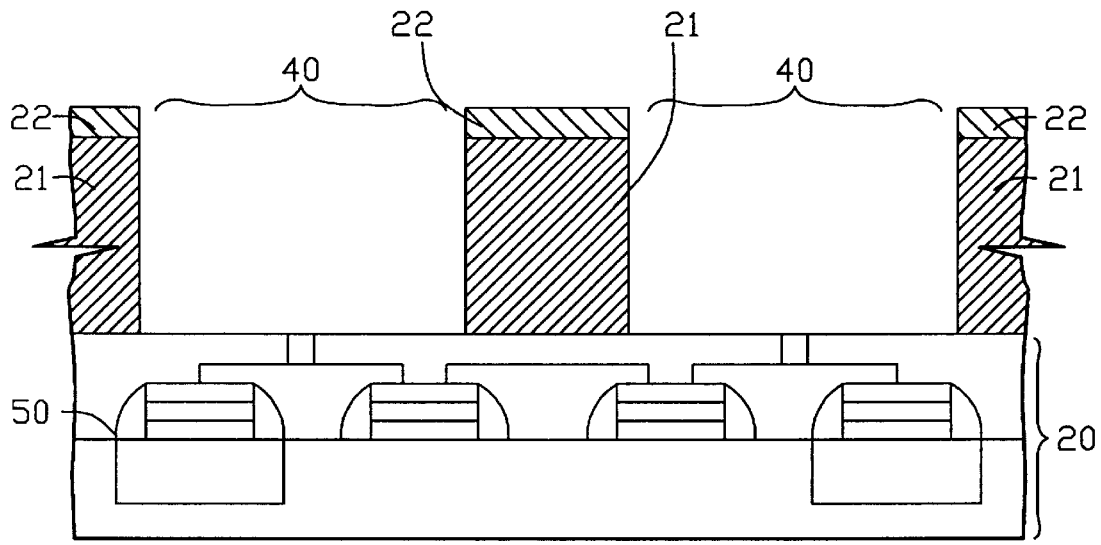

Consequentially, as FIG. 2C, a portion of the first nitride layer 22 and a portion of the first oxide layer 21 are all etched by using the conventional dry plasma etching until the semiconductor substrate being exposed to define a first opening. The first photoresist layer 61 is used as an etch mask.

Figure 2D:
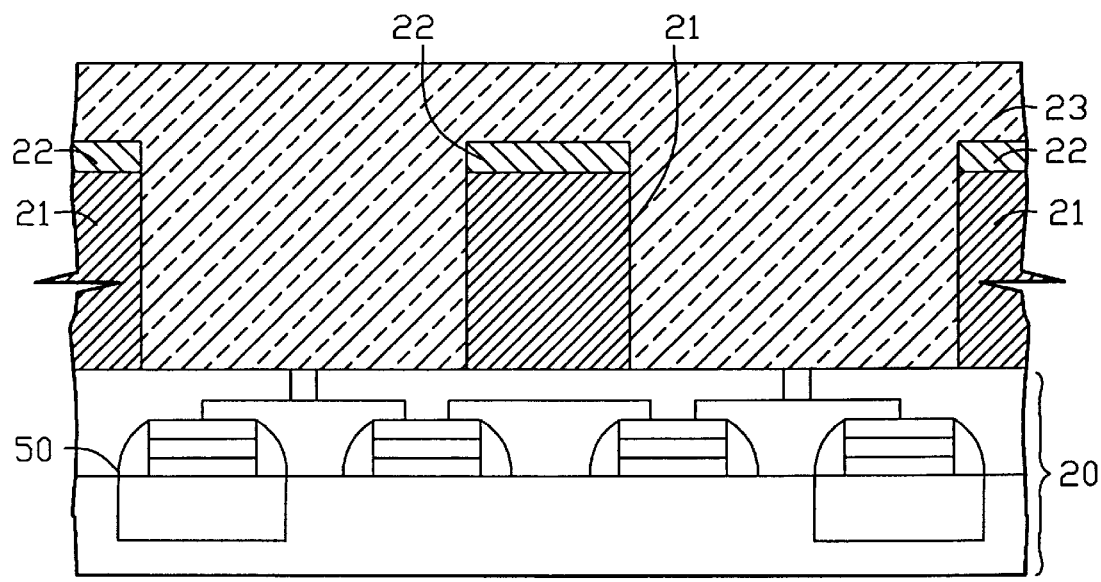

Then, as FIG. 2D, the first polysilicon layer 23 is formed on the surface of the semiconductor substrate 20 and on the surface of the first nitride layer 22 using the chemical vapor deposition. The first polysilicon layer is filled up into the first opening 40 and is covered on the first nitride layer 22. The thickness between first polysilicon layer 23 to the first silicon nitride 22 is about 1000 angstroms, the formation temperature is controlled at about 400° C. to 650° C. and the pressure is at about few torrs to 100 mtorrs.

Figure 2E:
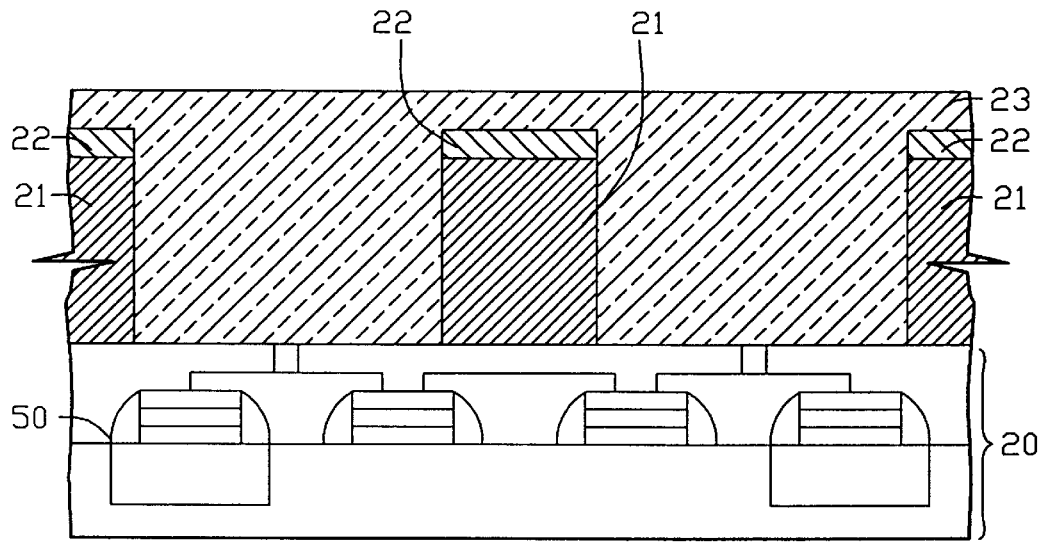

As FIG. 2E, by the conventional chemical mechanical polishing or dry etch, the portion of the first polysilicon layer 23 is reduced to a specified thickness, which is about 200 angstroms for the surface of the first polysilicon layer. The remained first polysilicon layer 23 can cover the first nitride layer 22 and covering the first opening 40.

Figure 2F:
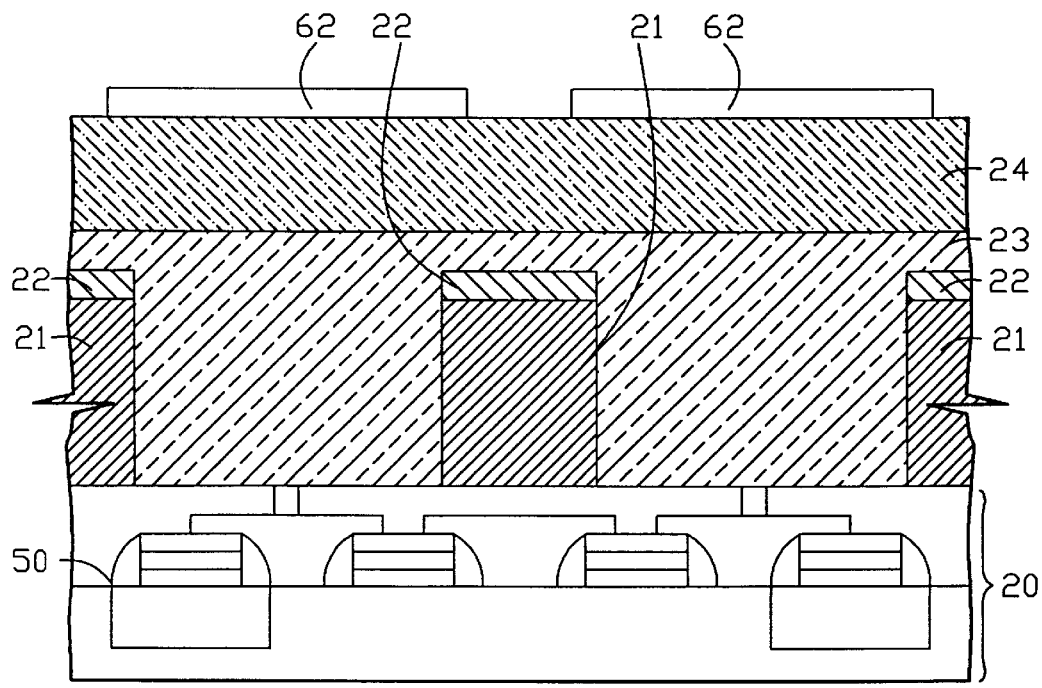

Next, as FIG. 2F, a boron phosphorus silicon glass layer 24 is blankly and conformably formed on the surface of the first polysilicon layer 23. Due to the character of boron phosphorus silicon glass layer 24 is used as a dielectric layer and is quite smooth. The formation temperature of this boron phosphorus silicon glass layer is controlled at about 850° C. A second photoresist 62 is formed on the boron phosphorus silicon glass layer 24 to define a capacitor region. Also, a boron phosphorus silicon glass layer can be replaced as a phosphorus silicon glass layer.

Figure 2G:
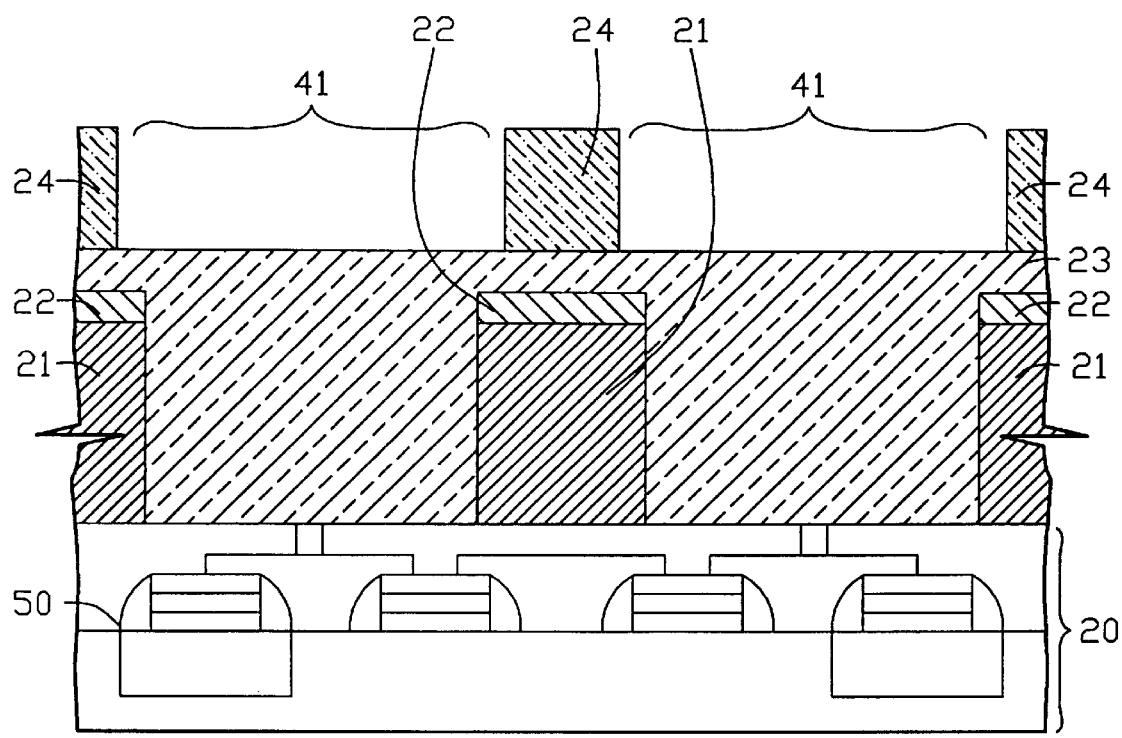

Then, as FIG. 2G, a portion of the boron phosphorus silicon glass layer 24 are etched as columns until the first polysilicon layer 23 is exposed to form a second opening 41 on the first opening.

Figure 2H:
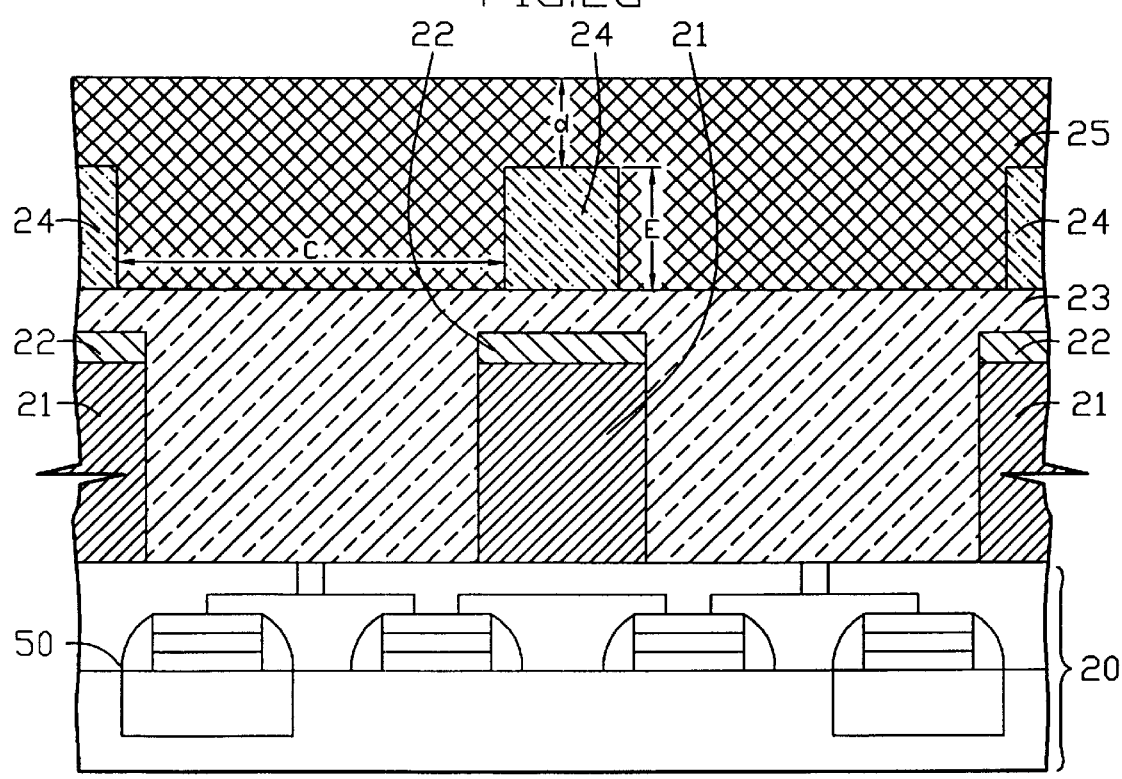

As FIG. 2H, legend c is 0.24 um (d=c/2), so legend d is 1200 angstroms and legend E is about 10000 to 12000 angstroms. By the chemical vapor deposition, a second polysilicon layer 25 is deposited into the second opening 41 to cover the surface of the boron phosphorus silicon glass layer 24. The thickness between second polysilicon layer 25 to the boron phosphorus silicon glass layer 24 is about 1200 angstroms, the formation temperature is controlled at about 400° C. to 800° C. and the pressure is at about few torrs to 100 mtorrs.

Figure 2I:
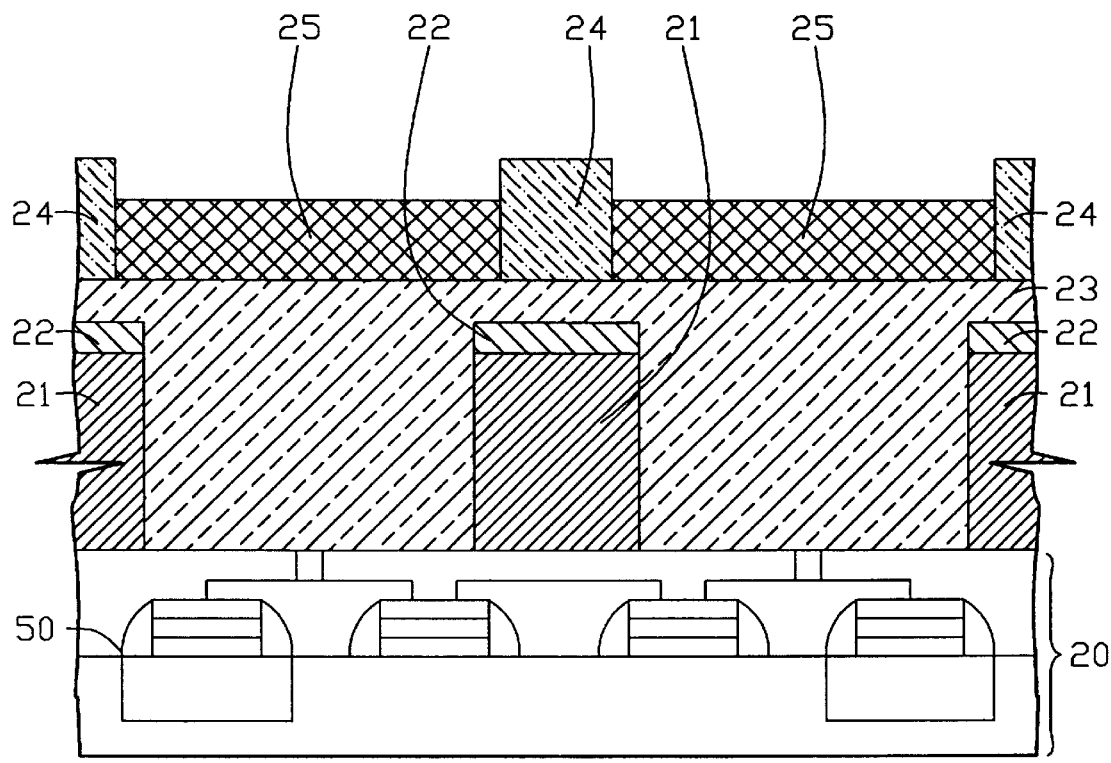

Next, as FIG. 2I, a portion of the second polysilicon layer 25 is etched back using the dry plasma etching until the surface of the boron phosphorus silicon glass layer 24 is exposed.

Figure 2J:
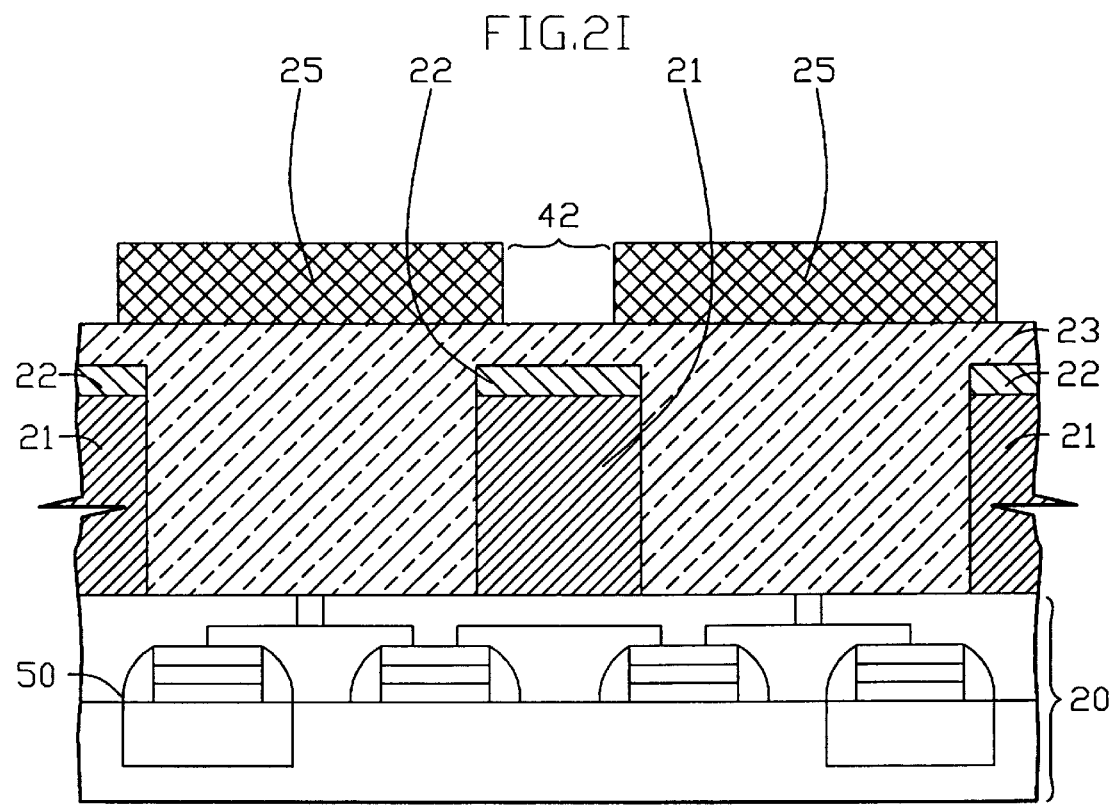

Next, as FIG. 2J, the columns of the boron phosphorus silicon glass layer 24 is removed using the dry plasma etching, whereby the second polysilicon layer 25 is remained on the surface of the first polysilicon layer 23.

Figure 2K:
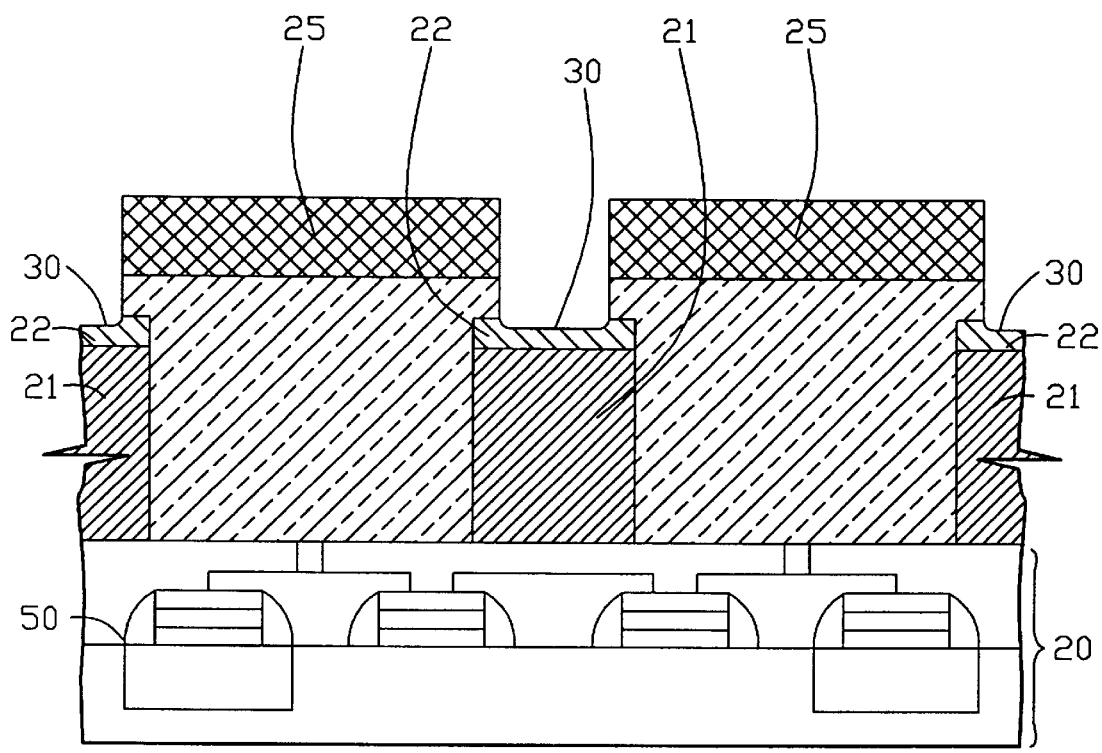

Then, as FIG. 2K, the first polysilicon layer 23 is etched back using the conventional plasma etching until the first nitride layer 22 is exposed, wherein the first polysilicon layer 23 is used as a bottom plate of the capacitor.

Figure 2L:
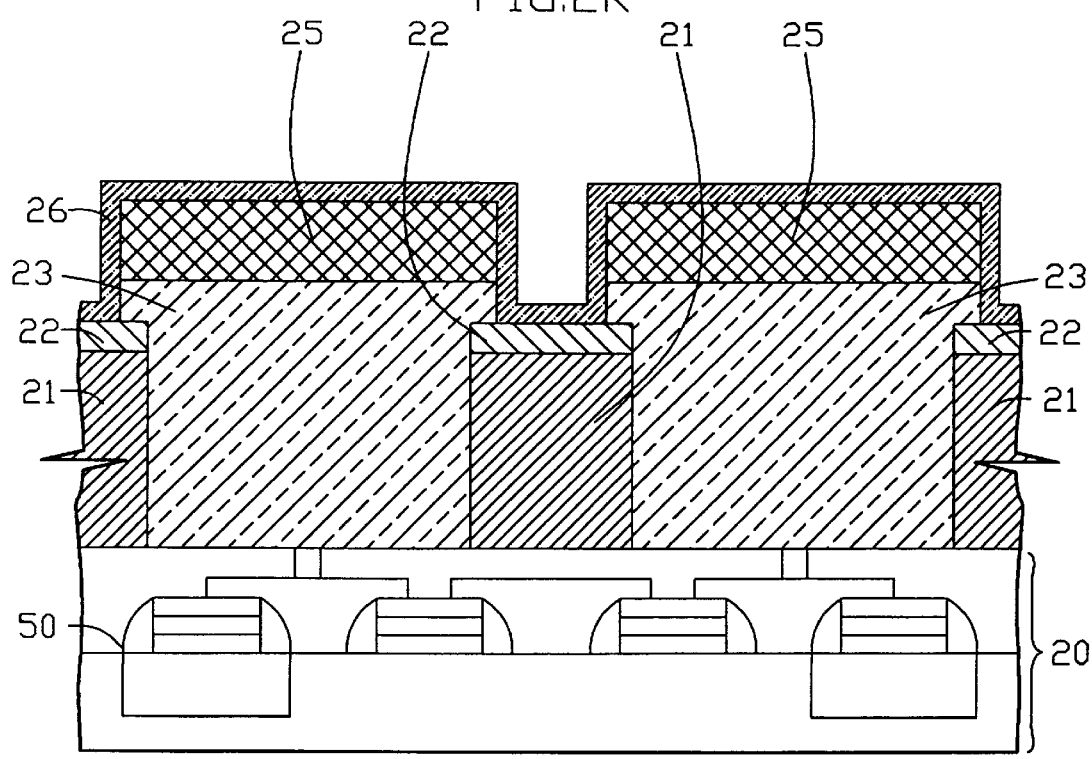

As FIG. 2L, a second nitride layer 26 is formed onto the surface 30 of the first nitride layer 22, the surface 30 of the first polysilicon layer 23 and the surface of the second polysilicon layer 25. The thickness of this second silicon dioxide layer is about 50 angstroms, the formation temperature is controlled at about 400° C. to 800° C. and the pressure is at about few torrs to 100 mtorrs.

Figure 2M:
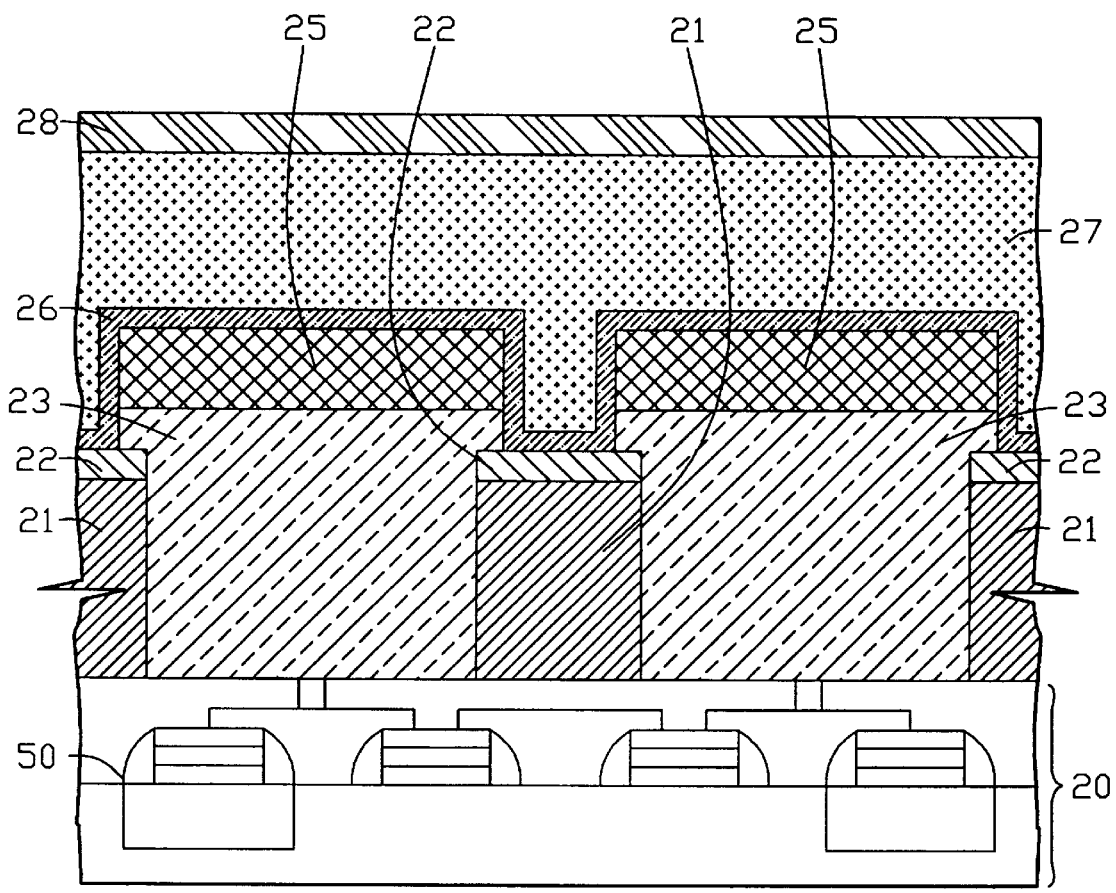

Next, as FIG. 2M, a second oxide layer 27 such as silicon oxide layer is deposited onto the surface of the second nitride layer 26. This thickness of second second oxide layer 27 is at about 6 to 8 angstroms. Finally, a conductive layer 28 is formed as a top plate of capacitor, so that a capacitor structure is completed and there are a top plate and a bottom plate for the capacitor.

According to the preferred embodiment, this present invention can reduce the topographic effect from the silicon nitride layer. The silicon nitride layer located on the polysilicon dielectric layer and etching back a portion of the polysilicon layer can form the bottom plate of capacitor. Also the thickness of silicon nitride layer can be reduced when the polysilicon layer is etching back.

First of all, a first oxide layer is deposited onto the surface of a semiconductor substrate. A first nitride layer is formed onto the surface of the first nitride layer. Then, a first photoresist is formed onto the first nitride layer to define a first opening. Consequentially, a portion of the first nitride layer and a portion of the first oxide layer are all etched using the first photoresist layer as an etch mask until the semiconductor substrate being exposed to define a first opening. Then, the first polysilicon layer is formed on the surface of the semiconductor substrate and on the surface of the first nitride layer, wherein the first polysilicon layer is filled up into the first opening and is covered on said first nitride layer. The portion of the first polysilicon layer is reduced to a specified thickness for the surface of the first polysilicon layer until the remained first polysilicon layer can cover the first nitride layer and covering the first opening. Next, boron phosphorus silicon glass layer blankly and conformably is formed on the surface of the first polysilicon layer. A second photoresist is formed on the boron phosphorus silicon glass layer to define a capacitor region. Then, a portion of said boron phosphorus silicon glass layer is etched until the first polysilicon layer is exposed to form a second opening on the first opening. A second polysilicon layer is deposited into the second opening to cover the surface of the boron phosphorus silicon glass layer. Next, a portion of the second polysilicon layer is etched back until the surface of the boron phosphorus silicon glass layer is exposed. Next, the boron phosphorus silicon glass layer is etched, whereby the second polysilicon layer is remained on the surface of the first polysilicon. Then, the first polysilicon first is etched back until the first nitride layer is exposed, wherein the first polysilicon layer is used as a bottom plate of the capacitor. A second nitride layer is formed onto the surface of the first nitride layer, the surface of the first polysilicon layer and the surface of the second polysilicon layer. Next, a second oxide layer is deposited onto the surface of the second nitride layer. Finally, a conductive layer is formed as a top plate of capacitor, whereby a capacitor structure is completed and there are a top plate and a bottom plate.

Although specific embodiments have been illustrated and described, it will be obvious to those skilled in the art that various modifications may be made without departing from what is intended to be limited solely by the appended claims.

What is claimed is:

1. A method for forming a capacitor structure of a semiconductor, comprising:
    providing a semiconductor substrate having a first oxide layer formed thereon, a first nitride layer being formed on the surface of the first oxide layer;
    etching a portion of said first nitride layer and a portion of said first oxide layer until said semiconductor substrate being exposed to form a first opening;
    forming a first conductive layer on the surface of said semiconductor substrate and on the surface of said first nitride layer, wherein said first conductive layer fills up said first opening and covers on said first nitride layer;
    blanket and conformably forming a dielectric layer on the surface of said first conductive layer;
    etching a portion of said dielectric layer until said first conductive layer is exposed to form a second opening on said first opening;
    depositing a second conductive layer into said second opening to cover the surface of said dielectric layer;
    etching back a portion of said second conductive layer until the surface of said dielectric layer being exposed;
    removing said dielectric layer until said first nitride layer being exposed, whereby said second conductive layer is remained as a capacitor bottom plate on the surface of said first conductive;
    forming a second nitride layer onto the surface of said first nitride layer, the surface of said first conductive layer and the surface of said second conductive layer;
    depositing a second oxide layer onto the surface of said second nitride layer; and
    forming a third conductive layer as a capacitor top plate, whereby completing a capacitor structure having said top plate and said bottom plate.

2. The method according to claim 1, wherein said semiconductor substrate comprises silicon.

3. The method according to claim 1, wherein said first and second oxide layers comprise silicon dioxide.

4. The method according to claim 1, wherein the material for said first and second nitride layers comprise silicon nitride.

5. The method according to claim 1, wherein said first conductive layer comprises polysilicon layer.

6. The method according to claim 1, wherein said etching a portion of said first nitride layer and a portion of said first oxide layer comprises dry plasma etch.

7. The method according to claim 1, wherein said dielectric layer comprises boron phosphorus silicon glass.

8. The method according to claim 7, wherein said dielectric layer further comprises phosphorus silicon glass layer.

9. The method according to claim 1, wherein said second conductive layer comprises polysilicon layer.

10. The method according to claim 1, wherein said third conductive layer comprises metal layer.

11. A method for forming a capacitor structure of a semiconductor, comprising;
    depositing a first oxide layer onto the surface of a semiconductor substrate;
    forming a first nitride layer onto the surface of said first oxide layer;
    forming a first photoresist onto said first nitride layer to define a first opening;
    etching a portion of said first nitride layer and a portion of said first oxide layer using said first photoresist layer as an etch mask until said semiconductor substrate being exposed to form a first opening;
    forming a first polysilicon layer on the surface of said semiconductor substrate and on the surface of said first nitride layer, wherein said first polysilicon layer fills up said first opening and covers on said first nitride layer;
    reducing a portion of said first polysilicon layer to a specified thickness for the surface of said first polysilicon layer until the remained said first polysilicon layer covering said first nitride layer and covering said first opening;
    blanket and conformably forming a dielectric layer comprises a boron phosphorus silicon glass layer on the surface of said first polysilicon layer;
    forming a second photoresist on said boron phosphorus silicon glass layer to define a capacitor region;
    etching a portion of said boron phosphorus silicon glass layer until said first polysilicon layer is exposed to form a second opening on said first opening;
    depositing a second polysilicon layer into said second opening to cover the surface of said boron phosphorus silicon glass layer;
    etching back a portion of said second polysilicon layer until the surface of said boron phosphorus silicon glass layer being exposed;
    etching said boron phosphorus silicon glass layer, whereby said second polysilicon layer is remained on the surface of said first polysilicon;
    etching back said first polysilicon first until said first nitride layer is exposed, wherein said first polysilicon layer being used as a bottom plate of said capacitor;
    forming a second nitride layer onto the surface of said first nitride layer, the surface of said first polysilicon layer and the surface of said second polysilicon layer;
    depositing a second oxide layer onto the surface of said second nitride layer; and
    forming a conductive layer as a top plate of capacitor, whereby completing a capacitor structure having said top plate and said bottom plate.

12. The method according to claim 11, wherein the material for said semiconductor substrate comprises silicon.

13. The method according to claim 11, wherein the material for said first and second oxide layers comprise silicon dioxide.

14. The method according to claim 11, wherein the material for said first and second nitride layers comprise silicon nitride.

15. The method according to claim 11, wherein said etching a portion of said first nitride layer and a portion of said first oxide layer comprises dry plasma etch.

16. The method according to claim 11, wherein removing a portion of said first polysilicon layer comprises dry plasma etch.

17. The method according to claim 11, wherein reducing a portion of said first polysilicon layer comprises chemical mechanical polishing.

18. The method according to claim 11, wherein said dielectric layer further comprises phosphorus silicon glass.

19. The method according to claim 11, wherein said conductive layer comprises metal layer.

* * * * *